United States Patent
Cheng et al.

(10) Patent No.: US 11,659,690 B2
(45) Date of Patent: May 23, 2023

(54) FIXING STRUCTURE FOR A HEAT DISSIPATION DEVICE

(71) Applicant: Cooler Master Co., Ltd., New Taipei (TW)

(72) Inventors: Jen-Chih Cheng, New Taipei (TW); Shui-Fa Tsai, New Taipei (TW)

(73) Assignee: Cooler Master Co., Ltd., New Taipei (TW)

( * ) Notice: Subject to any disclaimer, the term of this patent is extended or adjusted under 35 U.S.C. 154(b) by 0 days.

(21) Appl. No.: 17/382,450

(22) Filed: Jul. 22, 2021

(65) Prior Publication Data
US 2022/0369500 A1 Nov. 17, 2022

(30) Foreign Application Priority Data
May 12, 2021 (TW) .................................. 110117167

(51) Int. Cl.
*H05K 7/20* (2006.01)
*F28F 9/007* (2006.01)
(52) U.S. Cl.
CPC ........... *H05K 7/2049* (2013.01); *F28F 9/007* (2013.01); *F28F 2275/20* (2013.01)
(58) Field of Classification Search
CPC .... F28F 2275/20; F28F 9/007; H05K 7/2049; F16B 21/071; F16B 35/041
USPC ............................................... 165/80.2, 80.3
See application file for complete search history.

(56) References Cited

U.S. PATENT DOCUMENTS

| | | | | | |
|---|---|---|---|---|---|
| 2,807,854 | A | * | 10/1957 | Mellen | F16B 37/085 411/554 |
| 3,782,437 | A | * | 1/1974 | Seckerson | F16B 39/24 411/979 |
| 5,695,178 | A | * | 12/1997 | Lenzkes | B25B 5/006 269/93 |
| 7,301,774 | B2 | * | 11/2007 | Lee | H01L 23/4006 174/16.3 |
| 7,573,716 | B2 | * | 8/2009 | Sun | H05K 1/0201 174/16.3 |
| 7,609,522 | B2 | * | 10/2009 | Jin | H01L 23/4006 257/722 |
| 8,120,919 | B2 | * | 2/2012 | Lyon | G06F 1/20 361/679.48 |

(Continued)

FOREIGN PATENT DOCUMENTS

TW 200821802 A 5/2008

*Primary Examiner* — Devon Russell
(74) *Attorney, Agent, or Firm* — Alan D. Kamrath; Karin L. Williams; Mayer & Williams PC

(57) ABSTRACT

A fixing structure of a heat dissipation device is provided. The fixing structure has a plate portion and at least one fixing set. The plate portion forms an opening and at least one groove. The opening and the groove form through the plate portion. The opening is configured to fix a heat dissipation assembly. The fixing set is mounted through the groove and can be moved in an extending direction of the groove and a direction perpendicular to the plate portion. The shape of the groove may correspond to various locations of the fixing hole on the various substrates. The fixing set can be moved in the groove to align various fixing holes of the substrate. In other words, with the movable fixing sets, the fixing structure can be mounted on various substrates or correspond to the electronic component in various shapes and dimensions.

4 Claims, 13 Drawing Sheets

(56) References Cited

U.S. PATENT DOCUMENTS

| | | | |
|---|---|---|---|
| 9,565,787 B2* | 2/2017 | Ho | H01L 23/4006 |
| 2003/0159819 A1* | 8/2003 | Lee | H01L 23/4093 |
| | | | 165/185 |
| 2007/0097649 A1* | 5/2007 | Yang | H01L 23/4006 |
| | | | 257/E23.084 |
| 2009/0308573 A1* | 12/2009 | Sun | H01L 23/3672 |
| | | | 165/80.3 |
| 2010/0097766 A1* | 4/2010 | Wu | H01L 23/467 |
| | | | 361/720 |
| 2011/0149503 A1* | 6/2011 | Wu | H01L 23/4006 |
| | | | 361/688 |
| 2013/0056192 A1* | 3/2013 | Lee | F16B 41/002 |
| | | | 165/185 |
| 2013/0340973 A1* | 12/2013 | Zhou | H01L 23/4006 |
| | | | 165/80.1 |

* cited by examiner

FIXING STRUCTURE FOR A HEAT DISSIPATION DEVICE

BACKGROUND OF THE INVENTION

1. Field of the Invention

The present invention relates to a fixing structure for a heat dissipation device, especially to a fixing structure configured to fix the heat dissipation device on an electronic component.

2. Description of the Prior Arts

Nowadays, the electronic components are installed in higher and higher densities and the computing performance is getting higher and higher, so the heating efficiency per unit time is getting higher and higher correspondingly. If heat is not dissipated immediately, the accumulated heat may raise the temperature of the electronic components, deteriorating the performance of the electronic components, or even damaging the electronic components. Therefore, the electronic components with high frequency need a proper heat dissipation device to maintain the performance.

Precisely, as shown in FIG. 13, an electronic component 92 is securely mounted on a substrate 91 of a motherboard and said substrate 91 forms multiple fixing holes 910. The fixing holes 910 may be located surrounding the electronic component 92. To attach a heat dissipation device 93 on the electronic component 92 for dissipating heat form the electronic component 92, the heat dissipation device 93 should be assembled with a fixing frame 94, then the fixing frame 94 is fixed on the fixing holes 910 via fixing means. However, because the electronic component 92 may be provided in various types and sizes, the fixing holes 910 may be arranged in various locations on one substrate 91 to avoid interfering with the electronic component 92. Correspondingly, the fixing frame 94 may have multiple through holes 940 to align with the fixing holes 910 for fixing. However, there are too many possible arrangements of the fixing holes 910 of the substrate 91, and one fixing frame 94 forming many arrangements of through holes 940 or many fixing frames 94 with different arrangements of through holes 940 are needed.

To overcome the shortcomings, the present invention provides a fixing structure for a heat dissipation device to mitigate or obviate the aforementioned problems.

SUMMARY OF THE INVENTION

The main objective of the present invention is to provide a fixing structure for a heat dissipation device that can be fixed on various substrates or correspond to various electronic components.

The fixing structure has a plate portion and at least one fixing set. The plate portion forms an opening and at least one groove. The opening and the at least one groove is formed through the plate portion. The at least one fixing set is mounted through and located in the at least one groove. The at least one fixing set is moveable in an extending direction of the at least one groove and moveable in a direction perpendicular to the plate portion.

Thus, one of the advantages of the present invention is that: with one groove corresponding to multiple fixing holes on the substrate and the fixing set can be moved in the groove, the fixing set can align to various fixing holes. In other words, with the movable fixing set, the fixing structure of the present invention can be fixed on various substrates or correspond to various electronic components so that the fixing frames for various substrates or various electronic components are no longer needed.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
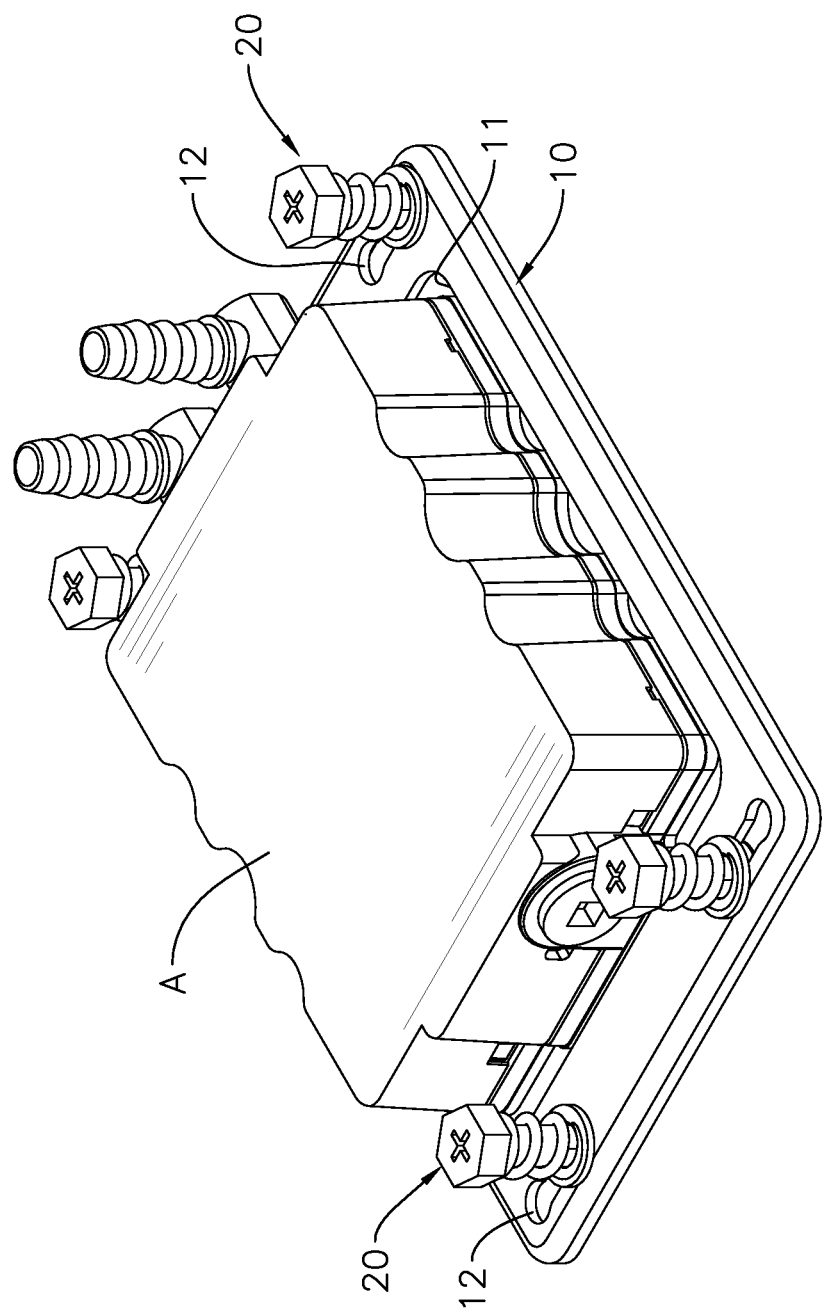
FIG. 1 is an operational perspective view of a fixing structure for a heat dissipation device in accordance with the present invention, showing a heat dissipation assembly.
Figure 2:
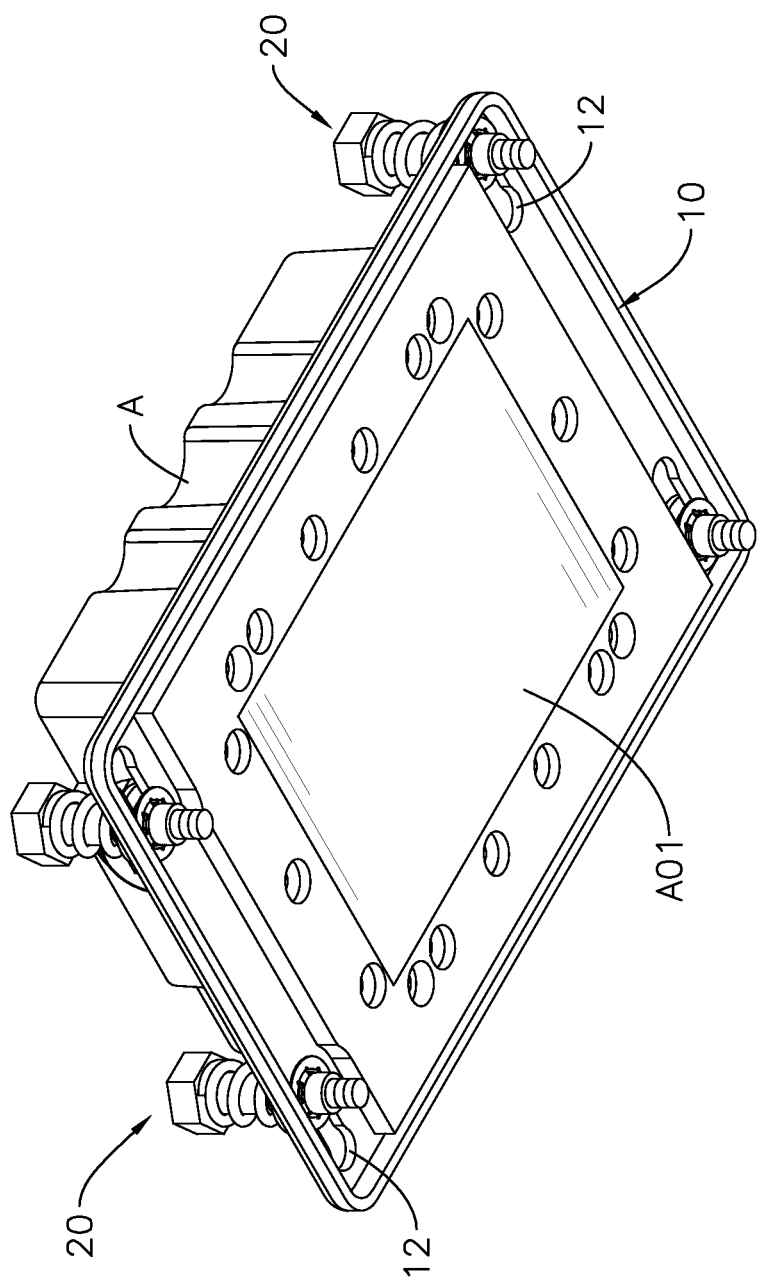
FIG. 2 is another operational perspective view of the fixing structure in FIG. 1.

With reference to FIG. 1 and FIG. 2, a fixing structure for a heat dissipation device in accordance with the present invention is provided. Normally, a heat dissipation device comprises a heat dissipation assembly A and a fixing structure. The heat dissipation assembly A may be a fin assembly or a water block assembly, and the heat dissipation assembly A is adapted to contact an electronic component (not shown in the drawings), e.g. CPU or GPU which may be a heat source. Thus, the heat dissipation assembly A can facilitate heat dissipation of the electronic component. Precisely, the heat dissipation assembly A may have a heat absorbing surface A01 configured to attach onto a heat source (not shown in the drawings).

Figure 3:
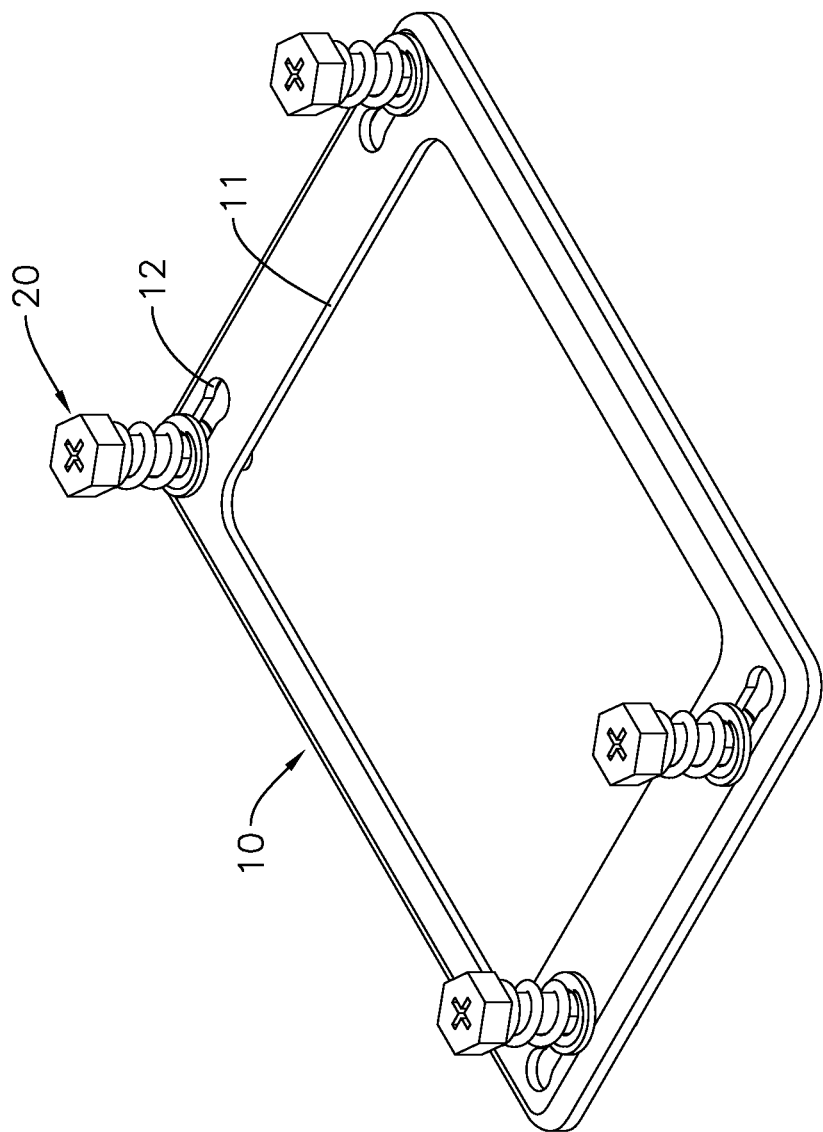
FIG. 3 is a perspective view of the fixing structure in FIG. 1.
Figure 4:
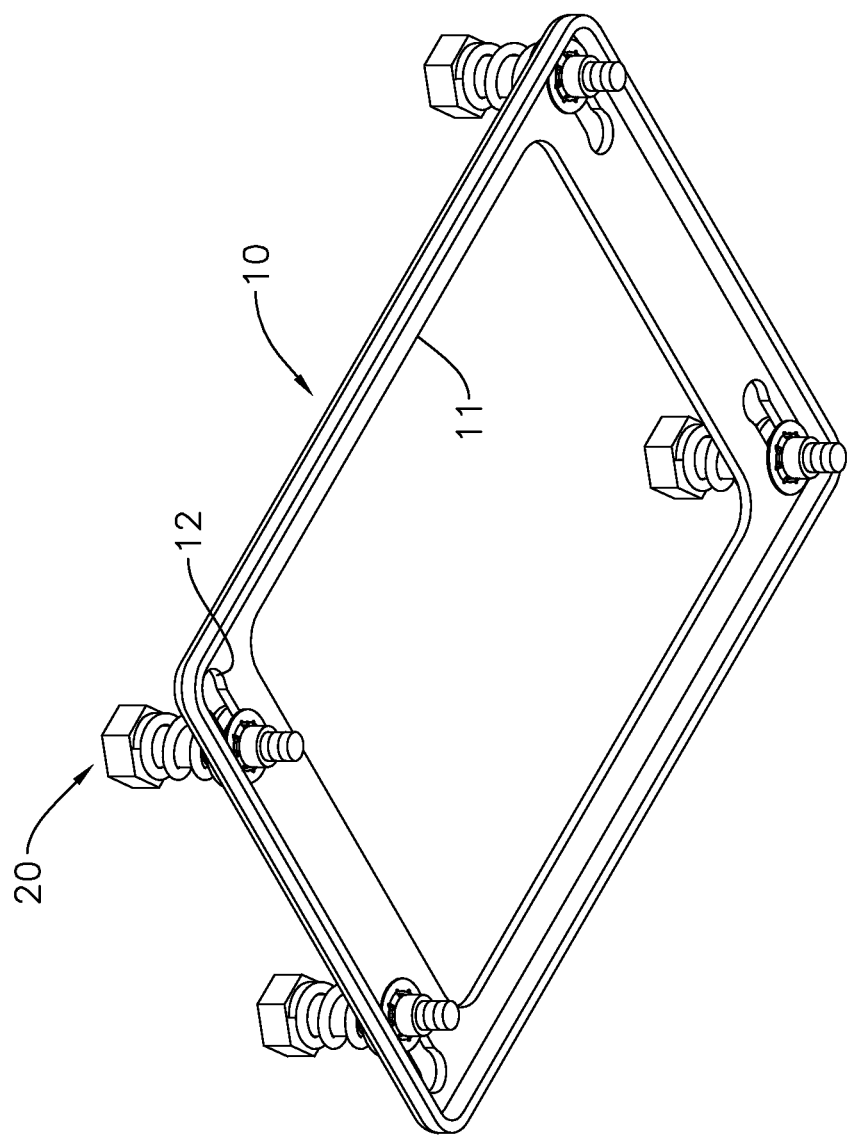
FIG. 4 is another perspective view of the fixing structure in FIG. 3.

Then please also refer to FIG. 3 and FIG. 4. The fixing structure for a heat dissipation device in accordance with the present invention comprises a plate portion 10 and at least one fixing set 20.

The plate portion 10 is connected to the heat dissipation assembly A. The plate portion 10 forms an opening 11 and at least one groove 12. The opening 11 and the at least one groove 12 are formed through the plate portion 10. The heat dissipation assembly A may be mounted in the opening 11 and the heat absorbing surface A01 is exposed from the opening 11. In this embodiment, the fixing structure comprises multiple grooves 12 and the grooves 12 do not communicate with the opening 11. The grooves 12 are located surrounding the opening 11. In other words, the heat dissipation assembly A can be mounted between the grooves 12. Therefore, when the fixing set 20 is mounted through one of the grooves 12 to fix the fixing structure, the heat dissipation assembly A may be attached firmly on the electronic component.

Figure 5:
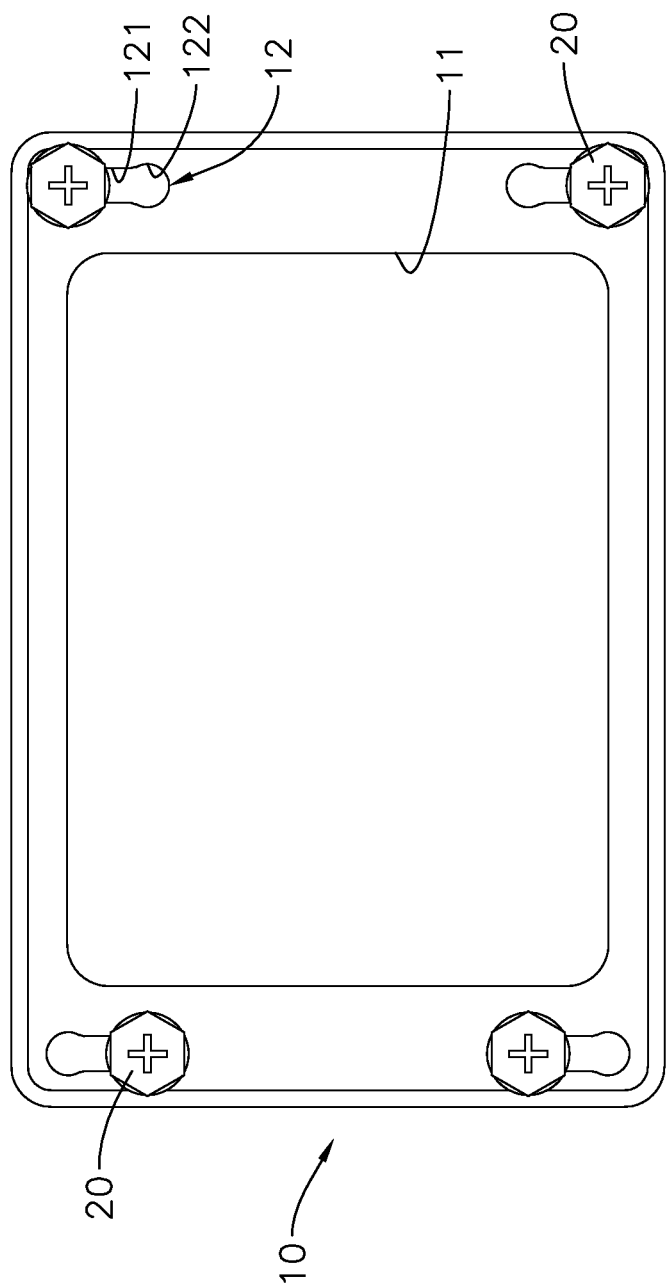
FIG. 5 is a top perspective view of the fixing structure in FIG. 3, showing a first configuration of the groove.
Figure 6:
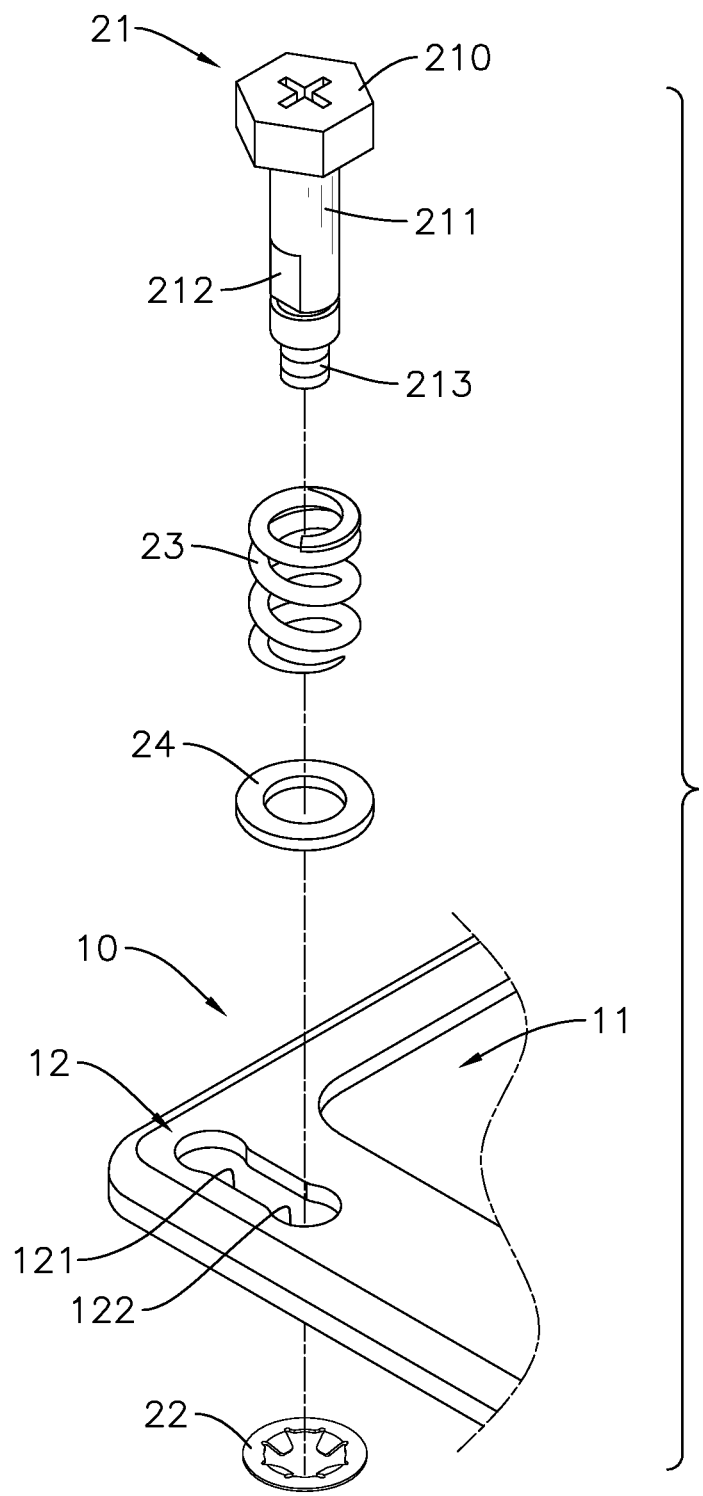
FIG. 6 is an exploded perspective view of a fixing set of the fixing structure in FIG. 3.
Figure 7:
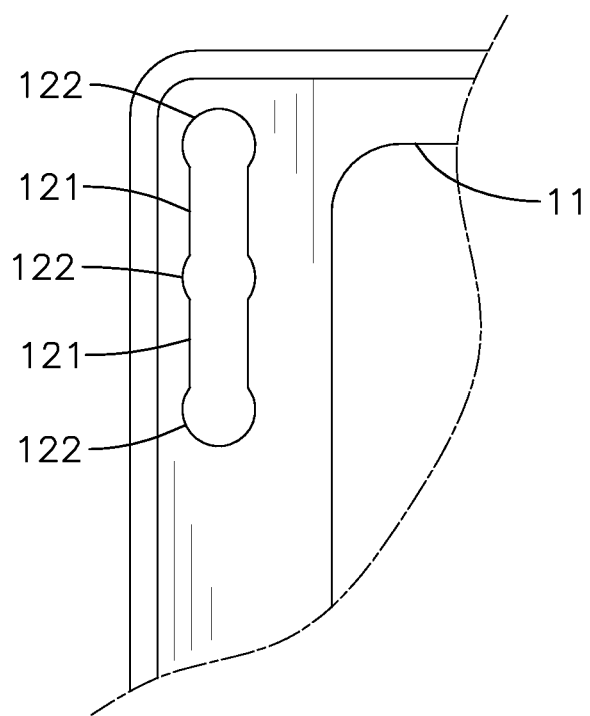
FIG. 7 is a top perspective view of the fixing structure, showing a second configuration of the groove.
Figure 8:
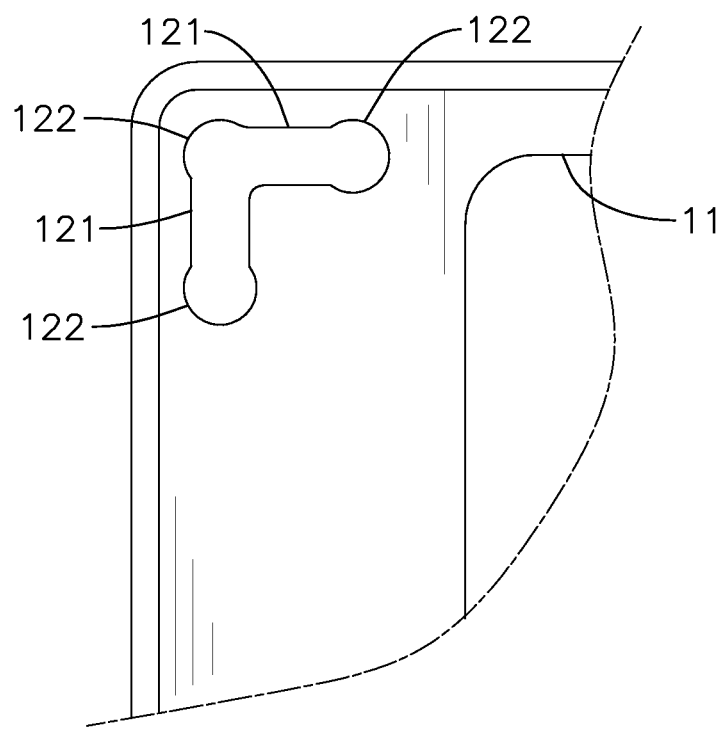
FIG. 8 is a top perspective view of the fixing structure, showing a third configuration of the groove.
Figure 9:
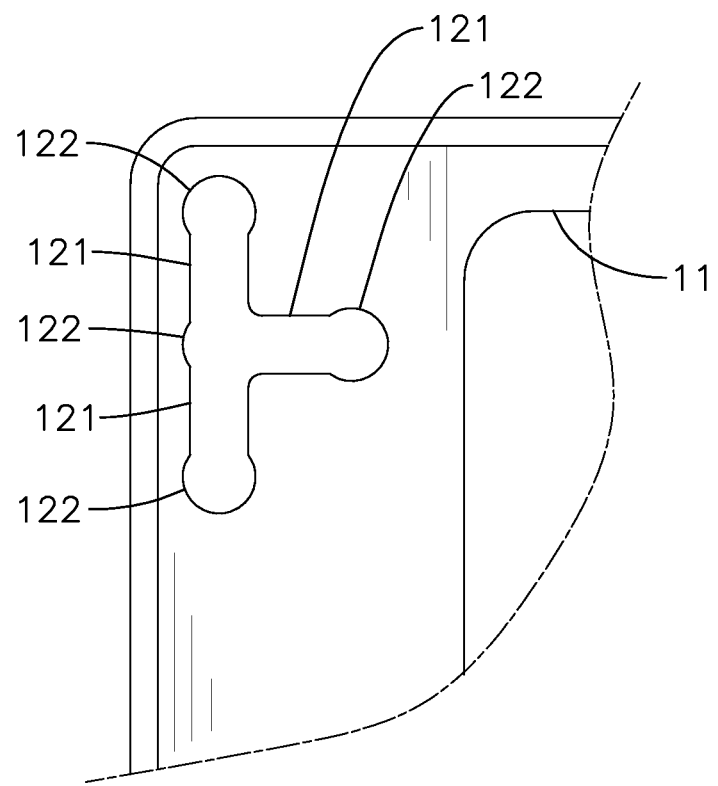
FIG. 9 is a top perspective view of a fixing set of the fixing structure, showing a fourth configuration of the groove.
Figure 10:
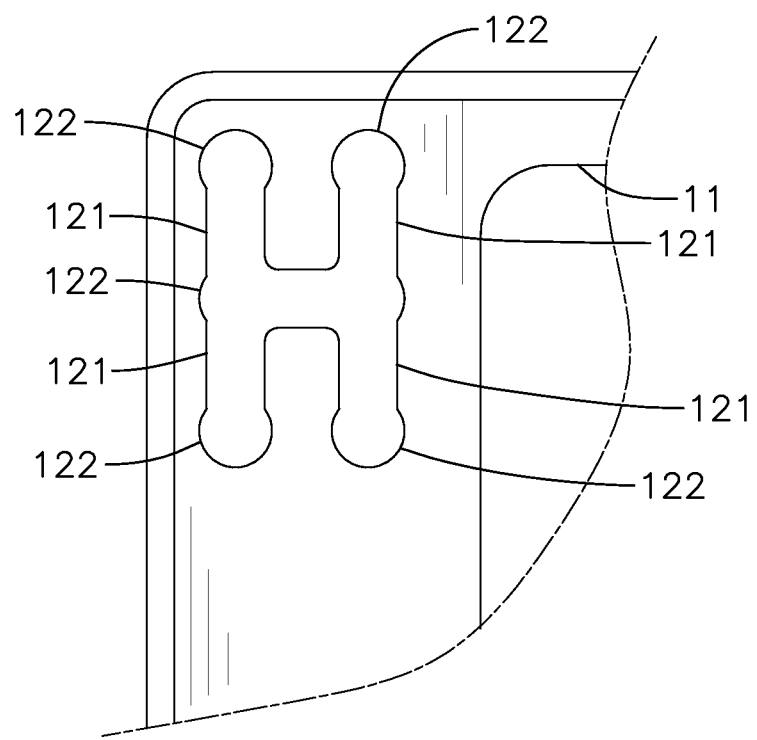
FIG. 10 is a top perspective view of the fixing structure, showing a fifth configuration of the groove.
Figure 11:
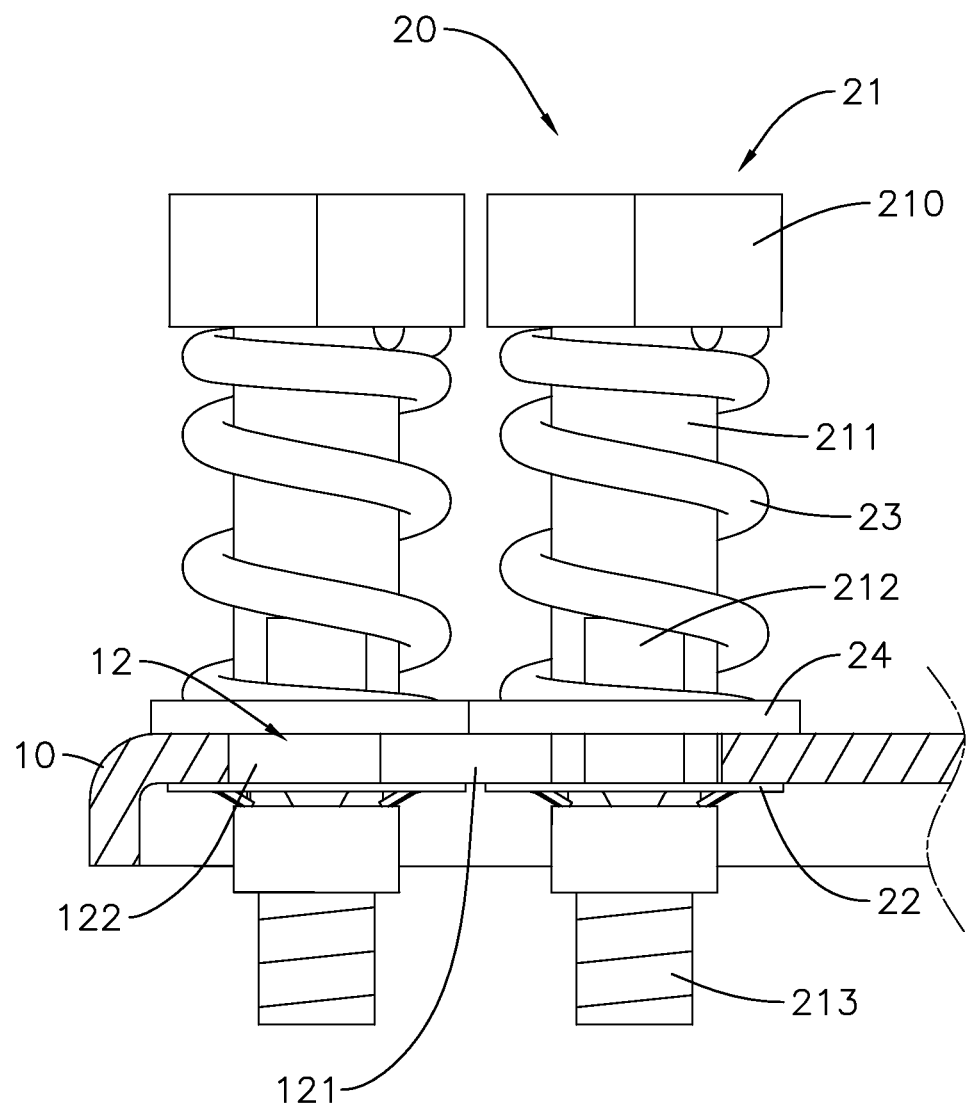
FIG. 11 is a sectional view of the groove in FIG. 5.
Figure 12:
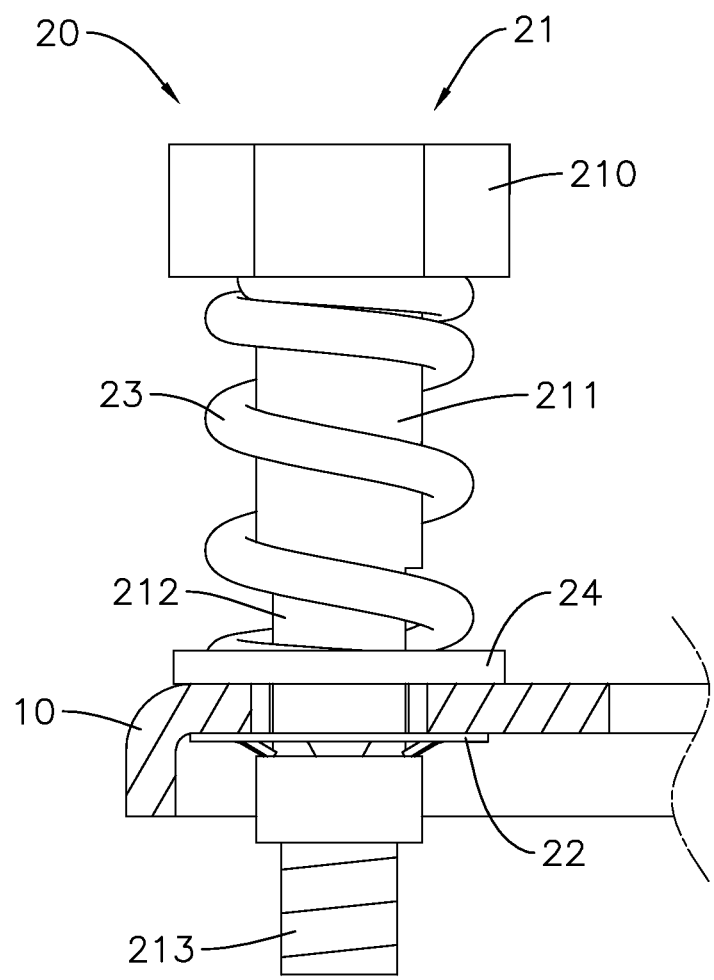
FIG. 12 is another sectional view of the groove in FIG. 5.
Figure 13:
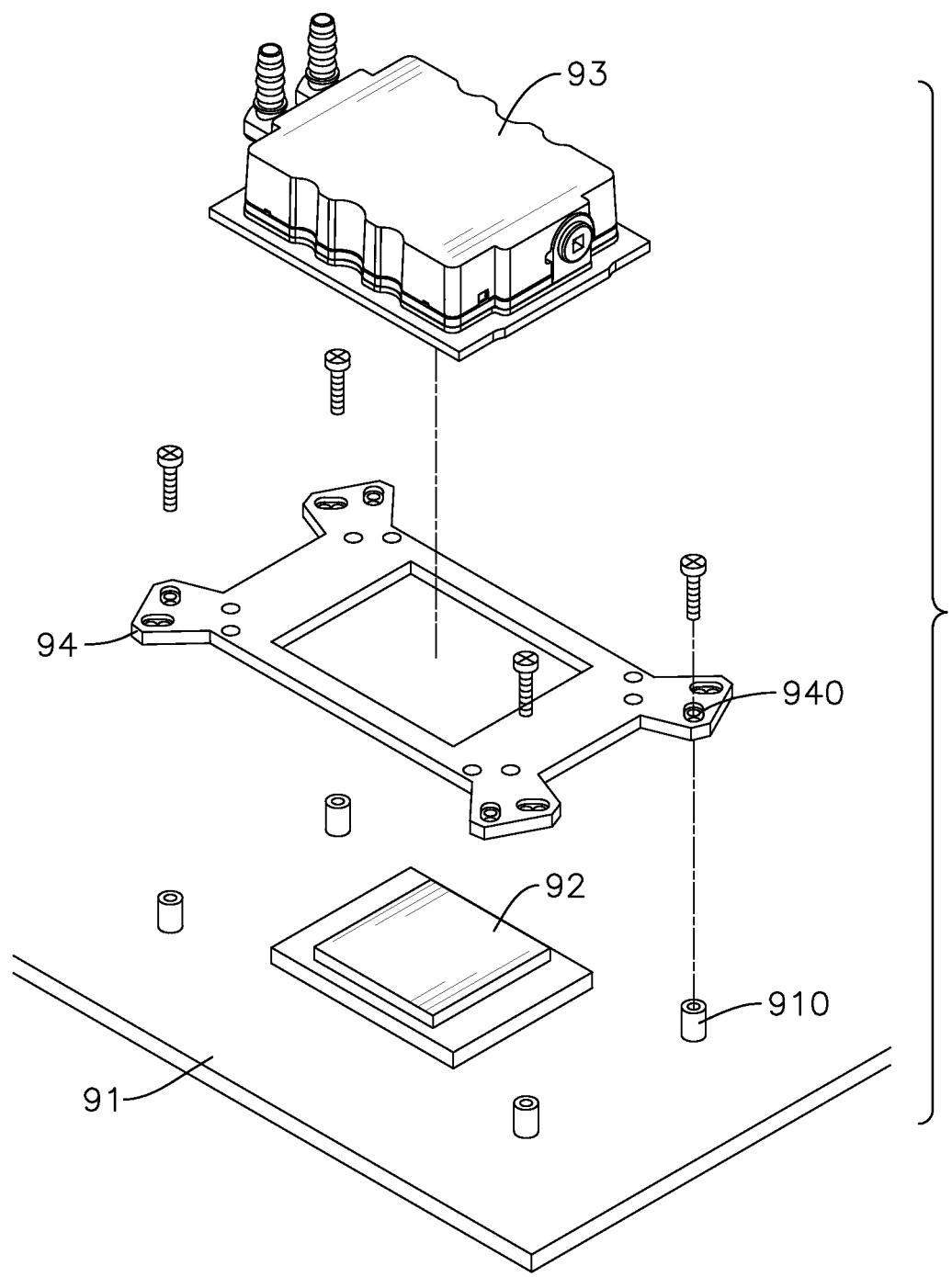
FIG. 13 is a perspective view of a conventional heat dissipation device.

Then please refer to FIG. 5 and FIG. 6. In a first configuration of the grooves 12, each one of the grooves 12 includes an elongated portion 121 and two round portions 122, and the elongated portion 121 and the two round portions 122 are formed through the plate portion 10. The two round portions 122 are respectively located at two ends of the elongated portion 121 and communicate with the two ends of the elongated portion 121. A diameter of each one of the round portions 122 is larger than a width of the elongated portion 121. Them please refer to FIG. 7 to FIG. 10. In another configuration of the groove 12, each one of the grooves 12 may include multiple elongated portions 121 and multiple round portions 122. An amount of the round portions 122 may be larger than that of the elongated portions 121 by one. The round portions 122 and the elongated portions 121 are staggered with each other and communicate with each other. Precisely, each end of each one of the elongated portions 121 communicates with one of the round portions 122 and said one of the round portions 122 is located between each adjacent two of the elongated portions 121. The elongated portions 121 may be arranged in a straight line (as shown in FIG. 5), in an L-shape (as shown in FIG. 6), in a T-shape (as shown in FIG. 7), in an H-shape (as shown in FIG. 8), or in an X-shape. However, it is not limited thereto. Them please refer to FIG. 6, FIG. 11, and FIG. 12. Each fixing set 20 is mounted through one of the grooves 12 and is moveable in an extending direction of said groove 12 and a direction perpendicular to the plate portion 10. When in the round portion 122 of the groove 12, the fixing set 20 is rotatable in the round portion 122. Each fixing set 20 comprises a screw 21 and a restriction component 22, and may selectively further comprise an elastic component 23 and a gasket 24.

The screw 21 is movably mounted through and located in the groove 12 and comprises a screw body and a screw head 210.

The screw body is movably mounted through and located in one of the grooves 12 and is moveable in an extending direction of said one of the grooves 12 and in a direction perpendicular to the plate portion 10. When located in the round portion 122 of said groove 12, the screw body is rotatable in the round portion 122. In this embodiment, the screw body may comprise a first segment 211, a second segment 212, and a thread segment 213. The second segment 212 is located between the thread segment 213 and the first segment 211.

A width of the first segment 211 is larger than that of the elongated portion 121 of the groove 12 but smaller than a diameter of the round portion 122 of the groove 12. A width of the second segment 212 is smaller than that of the elongated portion 121 of the groove 12. Therefore, the entire screw body can be rotated in the round portion 122 of the groove 12, but only when being moved perpendicular to the plate portion 10; as the second segment 212 is aligning to the elongated portion 121 of the groove 12, the screw body can be moved in the extending direction of the elongated portion 121. In other words, if the screw body is moved perpendicular to the plate portion 10 until the first segment 211 of the screw body is aligned to the elongated portion 121 of the groove 12, the screw body cannot be moved from the round portion 122 into the elongated portion 121.

The screw head 210 is securely mounted at an end of the screw body. The screw head 210 and the thread segment 213 of the screw body are located on two opposite sides of the plate portion 10. The restriction component 22 is securely mounted on the screw body. The restriction component 22 and the thread segment 213 are located at the same side of the plate portion 10. In other words, the screw head 210 and the restriction component 22 are located at the two opposite sides of the plate portion 10. Therefore, the screw body can be moved in the groove 12 and in the direction perpendicular to the plate portion 10, and the screw 21 is constrained by the screw head 210 and the restriction component 22 so that the screw 21 will not detach from the plate portion 10.

The elastic component 23 is sleeved on the screw body and is capable of moving the screw head 210 away from the plate portion 10. The gasket 24 is sleeved on the screw body and located between the elastic component 23 and the plate portion 10. With the elastic component 23 pushing the screw head 210 away from the plate portion 10, the second segment 212 of the screw body is kept aligning to the plate portion 10, which allows a user to move the screw 21 directly. In another embodiment, the fixing structure may not have the gasket 24, or may not have neither the elastic component 23 nor the gasket 24.

With such structure, the fixing set 20 can be moved in the groove 12 of the plate portion 10, so that the fixing set 20 can be adapted to various substrates and various electronic components in size, shape, or location of fixing holes. Precisely, when the fixing structure of the present invention is mounted on a substrate, the heat absorbing surface A01 of the heat dissipation assembly A is attached on an electronic component first, then the fixing set 20 is moved along the groove 12 into one of the round portions 122 and said round portion 122 is aligned to a fixing hole of the substrate. At this time, the screw 21 can be pressed down and the screw head 210 can be rotated so that the thread segment 213 is moved into the threaded fixing hole of the subject.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A fixing structure for a heat dissipation device, the fixing structure comprising:
   a plate portion forming an opening and at least one groove, the opening and the at least one groove formed through the plate portion; each one of the at least one groove comprising:
     an elongated portion formed through the plate portion; and
     two round portions formed through the plate portion and respectively communicating with two ends of the elongated portion; a diameter of each one of the two round portions being larger than a width of the elongated portion; and
   at least one fixing set mounted through and located in the at least one groove, the at least one fixing set being moveable in an extending direction of the at least one groove, moveable in a direction perpendicular to the plate portion and rotatable in the round portions; each one of the at least one fixing set comprising:

a screw mounted through and located in one of the at least one groove and comprising:
  a screw body perpendicularly mounted through the plate portion and located in said one of the at least one groove; the screw body, comprising:
    a first segment, a width thereof being larger than the width of the elongated portion of the at least one groove and smaller than the diameter of each of the round portions of the at least one groove;
    a second segment, a cross section of the second segment being non-circular and parallel with the plate portion; the cross section of the second segment having a first width and a second width, the first width being larger than the width of the elongated portion of the at least one groove, and the second width being smaller than the width of the elongated portion of the at least one groove; and
    a thread segment, the second segment located between the thread segment and the first segment; and
  a screw head securely mounted at an end of the screw body, and the screw head and the thread segment located at two opposite sides of the plate portion; and
  a restriction component securely mounted on the screw body, and the restriction component and the screw head located at the two opposite sides of the plate portion.

2. The fixing structure for a heat dissipation device as claimed in claim 1, wherein each one of the at least one fixing set further comprises an elastic component sleeved on the screw body and capable of moving the screw head away from the plate portion.

3. The fixing structure for a heat dissipation device as claimed in claim 2, wherein each one of the at least one fixing set further comprises a gasket sleeved on the screw body and located between the elastic component and the plate portion.

4. The fixing structure for a heat dissipation device as claimed in claim 1, wherein the at least one groove of the plate portion includes multiple grooves, and the opening is located between the multiple grooves.

\* \* \* \* \*